(12) United States Patent
Tsai et al.

(10) Patent No.: US 8,866,653 B2
(45) Date of Patent: Oct. 21, 2014

(54) SUCCESSIVE APPROXIMATION ANALOG TO DIGITAL CONVERTER AND METHOD THEREOF

(71) Applicant: Realtek Semiconductor Corp., Hsinchu (TW)

(72) Inventors: Jen-Huan Tsai, Hsinchu (TW); Po-Chiun Huang, Hsinchu (TW); Shawn Min, Zhubei (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 14/029,845

(22) Filed: Sep. 18, 2013

(65) Prior Publication Data

US 2014/0085118 A1  Mar. 27, 2014

(30) Foreign Application Priority Data

Sep. 26, 2012  (TW) .............................. 101135222 A (51) Int. Cl.
| | |
|---|---|
| H03M 1/00 | (2006.01) |
| H03M 1/12 | (2006.01) |
| H03M 1/46 | (2006.01) |
| H03M 1/68 | (2006.01) |

(52) U.S. Cl.
CPC .............. *H03M 1/124* (2013.01); *H03M 1/462* (2013.01); *H03M 1/466* (2013.01); *H03M 1/687* (2013.01)
USPC .......................................... 341/122; 341/155

(58) Field of Classification Search
USPC ......................................... 341/122, 155, 161
See application file for complete search history.

(56) References Cited

U.S. PATENT DOCUMENTS

| | | | | |
|---|---|---|---|---|
| 4,907,002 | A | * | 3/1990 | Kawada ......................... 341/172 |
| 6,329,938 | B1 | * | 12/2001 | Spaur et al. ................... 341/118 |
| 7,015,841 | B2 | * | 3/2006 | Yoshida et al. ............... 341/120 |

FOREIGN PATENT DOCUMENTS

| | | |
|---|---|---|
| TW | 200703919 | 1/2007 |
| TW | 200721694 | 6/2007 |
| TW | 200733573 | 9/2007 |
| TW | I320266 | 2/2010 |
| TW | I333336 | 11/2010 |

OTHER PUBLICATIONS

English Abstract translation of TWI333336 (Published Nov. 11, 2010).

(Continued)

*Primary Examiner* — Brian Young
(74) *Attorney, Agent, or Firm* — McClure, Qualey & Rodack, LLP (57) ABSTRACT

A successive approximation (SAR) analog-to-digital converter for generating a digital signal of N bits is provided. The converter includes a capacitive digital-to-analog conversion circuit including an (N−1)-th conversion unit to a first conversion unit. Each of the first conversion unit to the (N−2)-th conversion unit includes a capacitor. The (N−1)-th conversion unit comprises a number of sub-capacitors. Each of the sub-capacitors of the (N−1)-th conversion unit has substantially the same capacitance with corresponding capacitor of the first conversion unit to the (N−2)-th conversion unit. During the conversion process, the SAR control circuit, after generating the value of the most significant bit (MSB) of the digital signal, generates the value of the next bit by controlling the (N−1)-th conversion unit. Then, the SAR control circuit repeatedly uses at least one of the sub-capacitors of the (N−1)-th conversion unit to generate the value of other bits to perform self linear compensation.

14 Claims, 8 Drawing Sheets

(56) References Cited

OTHER PUBLICATIONS

English Abstract translation of TW200703919 (Published Jan. 16, 2007).
English Abstract translation of TW200721694 (Published Jun. 1, 2007).
English Abstract translation of TW200733573 (Published Sep. 1, 2007).
English Abstract translation of TWI320266 (Published Feb. 1, 2010).
Zhu, et al.: "A 10-bit 100-MS/s Reference-Free SAR ADC in 90 nm CMOS"; IEEE Journal of Solid-State Circuits, vol. 45, No. 6, Jun. 2010; pp. 1111-1121.
Liu, et al.: "A 10-bit 50-MS/s SAR ADC With a Monotonic Capacitor Switching Procedure", IEEE Journal of Solid-State Circuits, vol. 45, No. 4, Apr. 2010; pp. 731-740.

\* cited by examiner

SUCCESSIVE APPROXIMATION ANALOG TO DIGITAL CONVERTER AND METHOD THEREOF

This application claims the benefit of Taiwan application Serial No. 101135222, filed Sep. 26, 2012, the subject matter of which is incorporated herein by reference.

BACKGROUND OF THE INVENTION

1. Field of the Invention

The invention relates in general to a successive approximation (SAR) analog-to-digital converter and an analog-to-digital conversion method thereof, and more particularly to an SAR analog-to-digital converter using the capacitive digital-to-analog conversion circuit and an analog-to-digital conversion method thereof.

2. Description of the Related Art

Conventionally, the successive approximation (SAR) has been used and widely applied in various fields of application. In general, the SAR analog-to-digital converter comprises an SAR control unit, a digital-to-analog conversion unit and a comparison unit. The comparison unit compares the inputted analog voltage with the reference voltage provided by the digital-to-analog conversion unit to obtain a comparison result. The SAR control unit determines the most significant bit (MSB) of the converted digital value with reference to the comparison result and adjusts the level of the reference voltage according to the MSB. The remaining bits can be converted by repeating the above operation. The SAR analog-to-digital converter can convert the inputted analog voltage to obtain the converted digital value.

In general, the digital-to-analog conversion unit of the SAR analog-to-digital converter is implemented by a capacitive digital-to-analog converter. According to existing technologies, the numeric accuracy of the capacitance is associated with the magnitude of the capacitance, and the larger the capacitance is, the higher the capacitance accuracy the capacitor has. The conventional method of increasing the capacitance accuracy to assure the linearity of the capacitive analog-to-digital converter is implemented by increasing the capacitance or area of each capacitor of the capacitive analog-to-digital converter.

SUMMARY OF THE INVENTION

According to one embodiment of the present invention, an analog-to-digital conversion method is provided. The method is used in a successive approximation (SAR) analog-to-digital converter to convert an analog signal to obtain a digital value. The digital value comprises an (N−1)-th to a 0-th bit sequentially corresponding to the most significant bit (MSB) to the least significant bit (LSB) of the digital value respectively, wherein N is an integer greater than 1. The analog-to-digital conversion method comprises the following steps: In step (a), a sampling-and-hold circuit is used to sample the analog signal to generate a sampling voltage. In step (b), a capacitive digital-to-analog conversion circuit is used to provide a comparison voltage, wherein the capacitive digital-to-analog conversion circuit comprises N−1 conversion units being an (N−1)-th conversion unit, and an (N−2)-th conversion unit to a first conversion unit respectively, the first conversion unit to the (N−2)-th conversion unit includes a first capacitor to an (N−2)-th capacitor respectively, the (N−1)-th conversion unit at least includes a first sub-capacitor, and a second sub-capacitor to an (N−2)-th sub-capacitor, and each of the first sub-capacitor to the (N−2)-th sub-capacitor has substantially the same capacitance with corresponding capacitor of the (N−2)-th capacitor to the first capacitor. In step (c), a comparator is used to compare the sampling voltage with the comparison voltage to generate a comparison signal. In step (d), an SAR control circuit is used to determine the (N−1)-th bit of the digital value according to the comparison signal. In step (e), the SAR control circuit is used to redistribute the charges stored in at least the first sub-capacitor to the (N−2)-th sub-capacitor of the (N−1)-th conversion unit according to the (N−1)-th bit to update the comparison voltage. In step (c') following step (e), the comparator is used to compare the sampling voltage with the updated comparison voltage to obtain the updated comparison signal. In step (f), the SAR control circuit is used to determine the (N−2)-th bit of the digital value according to the updated comparison signal and judge whether the (N−1)-th and the (N−2)-th bit correspond to the same logic value. In step (g), the SAR control circuit is used to re-distribute the charges stored in at least one of the first sub-capacitor to the (N−2)-th sub-capacitor of the (N−1)-th conversion unit to update the comparison voltage when the (N−1)-th bit and the (N−2)-th bit correspond to different logic values.

According to another embodiment of the present invention, an SAR analog-to-digital converter is provided. The SAR analog-to-digital converter performs conversion on an analog signal to obtain a digital value. The digital value includes an (N−1)-th to a 0-th bit sequentially corresponding to the MSB to the LSB of the digital value respectively, wherein N is an integer greater than 1. The analog-to-digital converter comprises a sampling-and-hold circuit, a capacitive digital-to-analog conversion circuit, a comparator and an SAR control circuit. The sampling-and-hold circuit samples the analog signal to generate a sampling voltage. The capacitive digital-to-analog conversion circuit provides a comparison voltage. The capacitive digital-to-analog conversion circuit comprises N−1 conversion units being an (N−1)-th conversion unit, and an (N−2)-th conversion unit to a first conversion unit. The first conversion unit to the (N−2)-th conversion unit includes a first capacitor to an (N−2)-th capacitor respectively. The (N−1)-th conversion unit at least includes a first sub-capacitor, a second sub-capacitor to an (N−2)-th sub-capacitor. Each of the first sub-capacitor to the (N−2)-th sub-capacitor has substantially the same capacitance with corresponding capacitor of the (N−2)-th capacitor to the first capacitor. The comparator is used to compare the sampling voltage with the comparison voltage to generate a comparison signal. The SAR control circuit is used to determine the (N−1)-th bit of the digital value according to the comparison signal and re-distributes the charges stored in at least the first sub-capacitor to the (N−2)-th sub-capacitor of the (N−1)-th conversion unit according to the (N−1)-th bit to update the comparison voltage. The comparator is further used to compare the sampling voltage with the updated comparison voltage to obtain the updated comparison signal. The SAR control circuit is further used to determines the (N−2)-th bit of the digital value according to the updated comparison signal and judges whether the (N−1)-th and the (N−2)-th bit correspond to the same logic value. When the (N−1)-th bit and the (N−2)-th bit correspond to different logic values, the SAR control circuit re-distributes the charges stored in at least one of the first sub-capacitor to the (N−2)-th sub-capacitor of the (N−1)-th conversion unit to update the comparison voltage.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 5A-5C shows another flowchart of an analog-to-digital conversion method according to a second embodiment of the invention;

DETAILED DESCRIPTION OF THE INVENTION

First Embodiment

Figure 1:
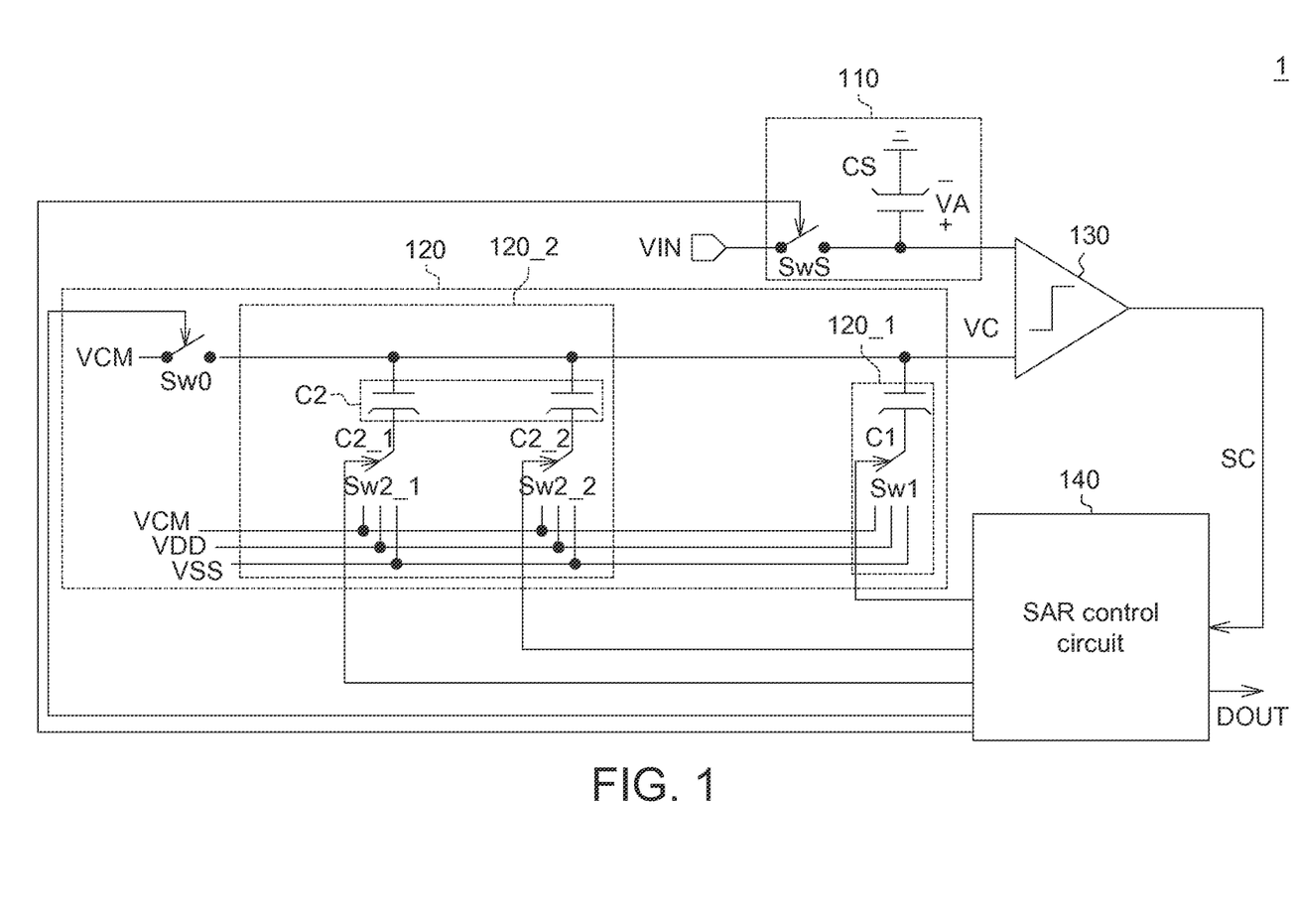
FIG. 1 shows a block diagram of an SAR analog-to-digital converter according to a first embodiment of the invention.

Referring to FIG. 1, a block diagram of a successive approximation (SAR) analog-to-digital converter according to a first embodiment of the invention is shown. The SAR analog-to-digital converter 1 of the present embodiment of the invention performs conversion on the analog signal VIN to obtain a digital value DOUT. The analog-to-digital converter 1 comprises a sampling-and-hold circuit 110, a capacitive digital-to-analog conversion circuit 120, a comparator 130 and an SAR control circuit 140. The sampling-and-hold circuit 110 and the capacitive digital-to-analog conversion circuit 120 are coupled to the comparator 130. The SAR control circuit 140 is coupled to the sampling-and-hold circuit 110, the capacitive digital-to-analog conversion circuit 120 and the comparator 130. The SAR control circuit 140 is the main control circuit of the analog-to-digital converter 1 for driving remaining sub-circuits to perform corresponding operations.

The sampling-and-hold circuit 110 samples the analog signal VIN to generate a sampling voltage VA, wherein the level range of the analog signal VIN is between the high level reference voltage VDD and the low level reference voltage VSS, and the ground reference voltage VCM is the middle value of the level range. For example, the sampling-and-hold circuit 110 comprises a capacitor CS and a switch SwS, wherein the switch SwS is controlled by the SAR control circuit 140 and is selectively turned on to sample the analog signal VIN and accordingly obtain the sampling voltage VA at the two ends of the capacitor CS.

The capacitive digital-to-analog conversion circuit 120 provides a comparison voltage VC. For example, the analog-to-digital converter 1 is an N-bit analog-to-digital converter, and the capacitive digital-to-analog conversion circuit 120 comprises N-1 conversion units 120_N-1, . . . , 120_1, wherein N is a natural number greater than 1, and the conversion unit 120_N-1 to the conversion unit 120_1 sequentially correspond to the most significant bit (MSB) Bit_N-1 to the second last bit Bit_1 of the digital value DOUT respectively.

In the example of FIG. 1, N is equal to 3. In other words, the capacitive digital-to-analog conversion circuit 120 comprises conversion units 120_2 to 120_1 corresponding to the MSB Bit_2 and the next bit Bit_1 of the digital value DOUT respectively. Furthermore, the conversion unit 120_1 comprises a capacitor C1 and a switch Sw1, wherein the switch Sw1 is controlled by the SAR control circuit 140 to selectively provide one of the high level reference voltage VDD, the low level reference voltage VSS and the ground reference voltage VCM to one end of the capacitor C1. By changing the voltage at one end of the capacitor C1, the charges of the capacitor C1 are re-distributed and the level of the comparison voltage VC is adjusted.

The conversion unit 120_2 comprises sub-capacitors C2_1 and C2_2, wherein the sub-capacitor C2_1 has substantially the same capacitance with the capacitor C1. The conversion unit 120_2 further comprises switches Sw2_1 and Sw2_2. The conversion unit 120_2 is controlled by the SAR control circuit 140 to selectively provide one of the high level reference voltage VDD, the low level reference voltage VSS and the ground reference voltage VCM to one end of the sub-capacitor C2_1 and one end of the sub-capacitor C2_2. By changing the voltage at one end of the sub-capacitors C2_1 and one end of the sub-capacitor C2_2, the charges of the sub-capacitors C2_1 and C2_2 are re-distributed and the level of the comparison voltage VC is adjusted.

In some operating examples, the switches Sw2_1 and Sw2_2 connect one end of the sub-capacitor C2_1 and one end of the sub-capacitor C2_2, such that the sub-capacitors C2_1 and C2_2 are connected in parallel to form an equivalent capacitor C2, wherein the ratio of the capacitance of the equivalent capacitor C2 to the capacitance of the capacitor C1 is such as is 2:1. In other words, in the operating example, the capacitances of the capacitor C1 and the equivalent capacitor C2 substantially form a numeric relationship of the power of 2. However, the invention is not limited thereto, and the capacitances of the capacitor C1 and the equivalent capacitor C2 do not have to form a numeric relationship of the power of 2 as long as the conversion unit 120_N-1 corresponding to the MSB Bit_N-1 comprises a number of sub-capacitors connected in parallel and at least one of the parallel-connected sub-capacitors of the conversion unit 120_N-1 may be repeatedly used during the analog-to-digital conversion process.

The capacitive digital-to-analog conversion circuit 120 further comprises a switch Sw0 controlled by the SAR control circuit 140 to selectively provide the ground reference voltage VCM to the other end of the capacitor C1 and the sub-capacitors C2_1 to C2_2.

The comparator 130 compares the magnitude of the sampling voltage VA with the magnitude of the comparison voltage VC to generate a comparison signal SC.

Figure 2:
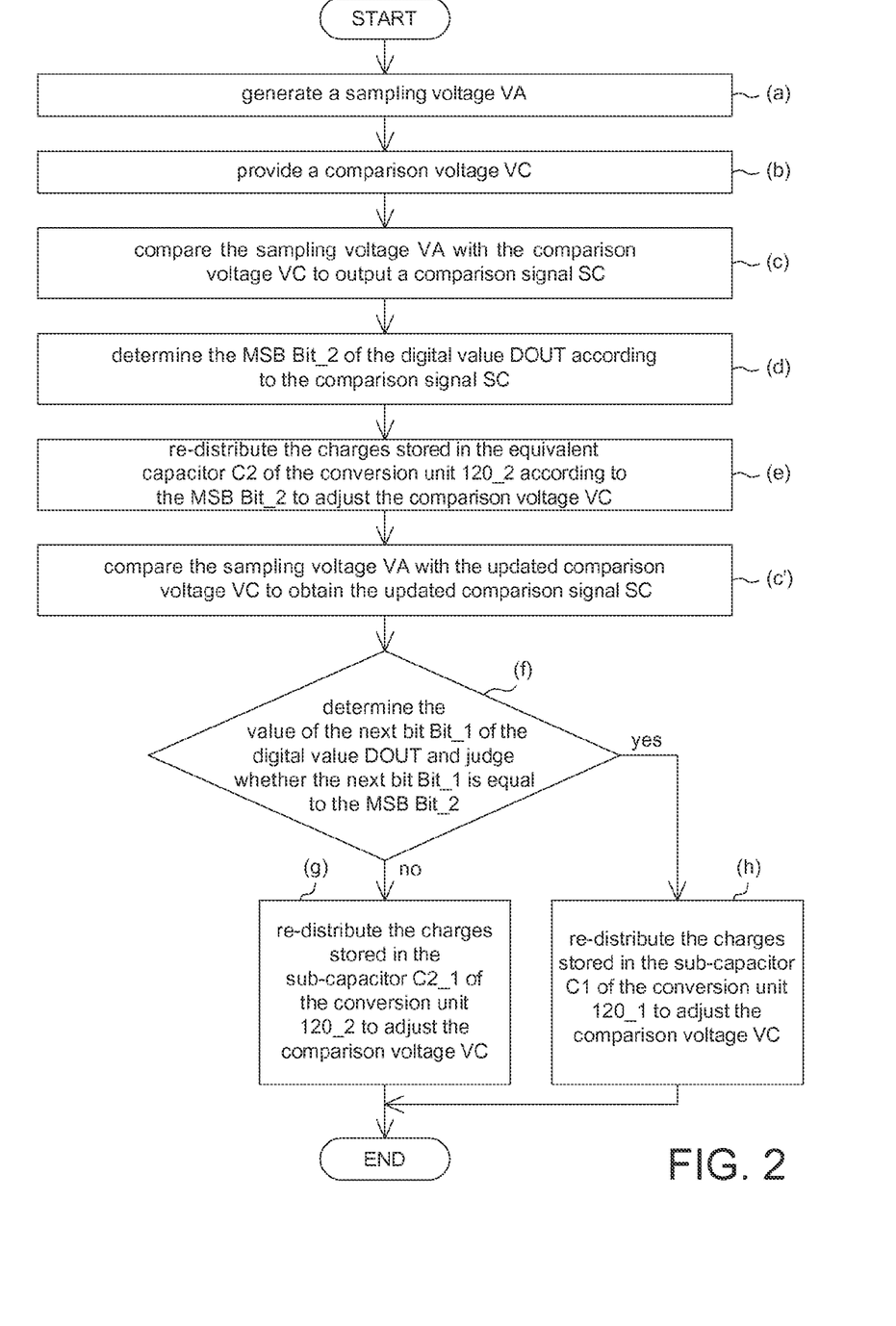
FIG. 2 shows a flowchart of an analog-to-digital conversion method according to a first embodiment of the invention.

Referring to FIG. 2, a flowchart of an analog-to-digital conversion method according to a first embodiment of the invention is shown. The SAR control circuit 140 determines a sampling-and-hold period and a decoding operation period, and executes an analog-to-digital conversion method during the above periods to control the analog-to-digital converter 1 to perform conversion on the analog signal VIN to obtain a digital value DOUT. Detailed operations are disclosed below with accompanying examples.

The Sampling-and-hold Period:

The analog-to-digital conversion method of the present embodiment of the invention begins at step (a). During the sampling-and-hold period, the SAR control circuit 140 turns on the switch SwS, such that the capacitor CS of the sampling-and-hold circuit 110 is used to sample the analog signal VIN to generate the sampling voltage VA. During the present sampling-and-hold period, the SAR control circuit 140 further turns on the switch Sw0, and switches the switches Sw1, Sw2_1 and Sw2_2 to the ground reference voltage VCM, such that the cross-voltage between two ends of the capacitor C1 and sub-capacitors C2_1 to C2_2 is substantially 0.

The Decoding Operation Period—the MSB Bit_2:

Steps (b)~(d) are executed during the decoding operation period. In steps (b)~(d), the SAR control circuit 140 correspondingly obtains the MSB Bit_2 of the digital value DOUT by way of signal decoding.

Furthermore, in step (b), the SAR control circuit 140 uses the capacitive digital-to-analog conversion circuit 120 to provide the comparison voltage VC. For example, during the sampling-and-hold period, the comparison voltage VC is initialized as the ground reference voltage VCM.

Figure 3A:
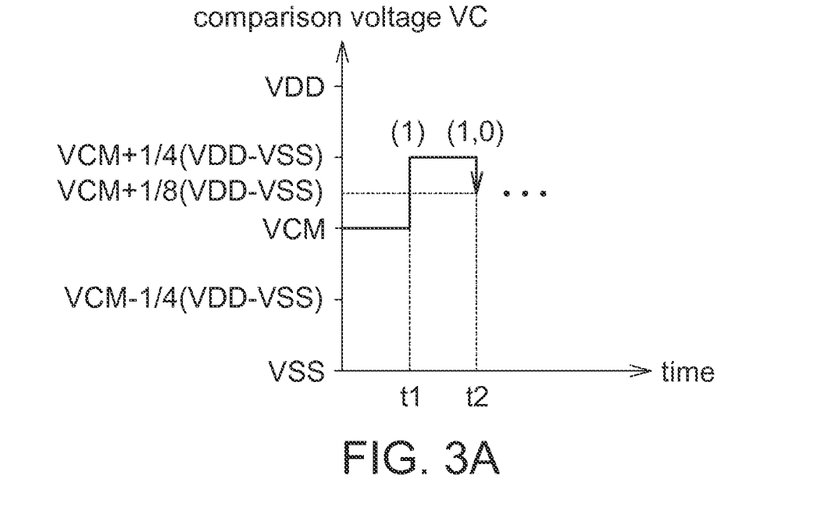
FIG. 3A and FIG. 3B respectively are a relationship diagram of a comparison voltage VC vs. a digital value DOUT when an analog-to-digital converter 1 of this embodiment performs a binary level search algorithm.
Figure 3B:
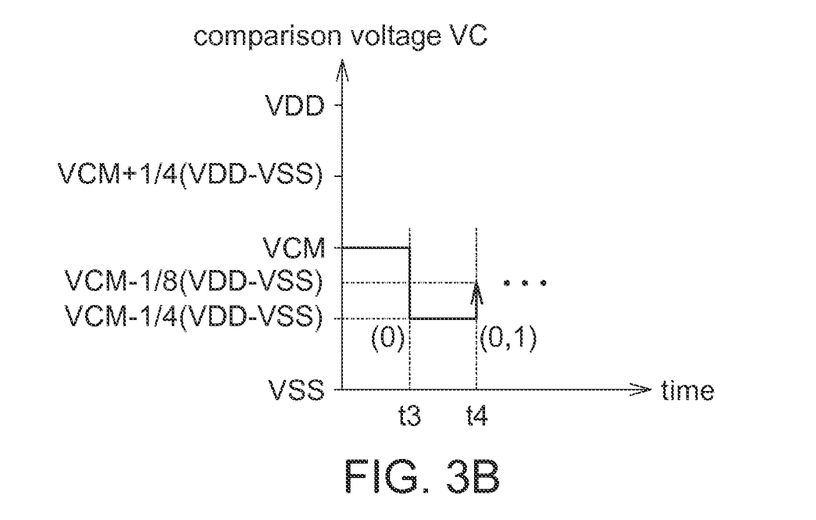

Referring to FIG. 3A and FIG. 3B, relationship diagrams of a comparison voltage VC vs. a digital value DOUT when an analog-to-digital converter 1 of this embodiment performs a binary level search algorithm are shown. In step (c), the comparator 130 compares the sampling voltage VA with the comparison voltage VC to output a comparison signal SC to indicate whether the sampling voltage VA is higher than the comparison voltage VC (corresponding to the ground reference voltage VCM). If yes, this implies that the level of the sampling voltage VA is higher than the middle value of the level range of the sampling voltage VA (that is, the range from the high level reference voltage VDD to the low level reference voltage VSS), and the MSB Bit_2 of the digital value DOUT correspondingly has logic value 1. Conversely, if the comparison signal SC indicates that the sampling voltage VA is lower than the comparison voltage VC, this implies that the level of the sampling voltage VA is lower than the middle value of the level range of the sampling voltage VA, and the digital value DOUT the MSB Bit_2 correspondingly has logic value 0.

Then, the method proceeds to step (d), the SAR control circuit 140 determines the value of the MSB Bit_2 of the digital value DOUT according to the comparison signal SC. The MSB Bit_2 of the digital value DOUT can be logic value 1 as in FIG. 3A or logic value 0 as in FIG. 3B, and the operation of decoding the MSB Bit_2 of the digital value DOUT is completed.

The decoding operation period—the next bit Bit_1 and the least significant bit (LSB) Bit_0:

Steps (e)~(h) are executed during the decoding operation period. In steps (e)~(h), the SAR control circuit 140 correspondingly obtains the next bit Bit_1 of the digital value DOUT by way of signal decoding.

Furthermore, in step (e), the SAR control circuit 140 triggers a level switch event on the conversion unit 120_2 according to the MSB Bit_2 to re-distribute the charges stored in the equivalent capacitor C2 of the conversion unit 120_2 to adjust the comparison voltage VC. When the sampling voltage VA is substantially higher than the comparison voltage VC, the SAR control circuit 140 uses the switches Sw2_1 and Sw2_2 to switch one end of the sub-capacitors C2_1 and C2_2 to be connected to the high level reference voltage VDD to increase the level of the reference voltage VC by (VDD−VSS)/4 (that is, (VDD−VCM)/2). At this time, the level of the reference voltage VC is equal to VCM+(VDD−VSS)/4 as indicated in the diagram corresponding to the time point t1 of FIG. 3A. Conversely, when the sampling voltage VA is substantially lower than the comparison voltage VC, the SAR control circuit 140 uses the switches Sw2_1 and Sw2_2 to switch the sub-capacitors C2_1 and C2_2 to the low level reference voltage VSS to decrease the level of the reference voltage VC by (VDD−VSS)/4 (that is, (VDD−VCM)/2 or (VCM−VSS)/2). At this time, the level of the reference voltage VC is equal to VCM−(VDD−VSS)/4 as indicated in the diagram corresponding to the time point t3 of FIG. 3B.

Next, the method proceeds to step (c'), the comparator 130 compares the sampling voltage VA with the updated comparison voltage VC (corresponding to VCM+(VDD−SS)/4 or VCM−(VDD−VSS)/4) to obtain the updated comparison signal SC.

Then, the method proceeds to step (f), the SAR control circuit 140 determines the value of the next bit Bit_1 of the digital value DOUT according to the updated comparison signal SC and judges whether the next bit Bit_1 and the MSB Bit_2 correspond to the same logic value. If no, this implies that the sampling voltage VA correspond to the middle digit of the digital value DOUT such as $(10x)_2$ or $(01x)_2$. That is, the values of the MSB Bit_2 and the next bit Bit_1 (Bit_2, Bit_1) of the digital value of the sampling voltage VA could be (1, 0) or (0, 1), and the "x" indicates that the logic value can be 0 or 1 as indicated in FIG. 3A and FIG. 3B. Thus, the SAR control circuit 140 executes step (g) to trigger a level switch event on the conversion unit 120_2 to re-distribute the charges stored in sub-capacitors C2_1 to adjust the comparison voltage VC.

Furthermore, in the operating example in which the sampling voltage VA corresponds to the middle digit $(10x)_2$, the SAR control circuit 140 already uses the switches Sw2_1 and Sw2_2 to switch the level of one end of the sub-capacitors C2_1 and C2_2 to the high level reference voltage VDD in step (e). In step (g), the SAR control circuit 140 again uses the switch Sw2_1 to switch one end of the sub-capacitor C2_1 to the ground reference voltage VCM from the high level reference voltage VDD such that the level of the reference voltage VC correspondingly drops to VCM+(VDD−VSS)/8 from VCM+(VDD−VSS)/4. At the time point t2 of FIG. 3A, the net shift of the reference voltage VC is (VDD−VSS)/8. After that, the comparator 130 compares the sampling voltage VA with the reference voltage VC. If the sampling voltage VA is higher than the reference voltage VC, then the SAR control circuit 140 determines that the value of the LSB Bit_0 is logic value 1; otherwise, the SAR control circuit 140 determines that the value of the LSB Bit_0 is logic value 0. At this time, the SAR control circuit 140 completes the analog-to-digital conversion of the analog signal VIN and can output a converted digital value DOUT.

Conversely, in the operating example in which the sampling voltage VA correspond to the middle digit $(01x)_2$, the SAR control circuit 140 already uses the switches Sw2_1 and Sw2_2 to switch the level of one end of the sub-capacitors C2_1 and C2_2 to the low level reference voltage VSS in step (e). In step (g), the SAR control circuit 140 again uses the switch Sw2_1 to switch one end of the sub-capacitor C2_1 to the ground reference voltage VCM from the low level reference voltage VSS such that the level of the reference voltage VC is correspondingly increased to VCM−(VDD−VSS)/8 from VCM−(VDD−VSS)/4. At the time point t4 of FIG. 3B, the net shift of the reference voltage VC is (VDD−VSS)/8. After that, the comparator 130 compares the sampling voltage VA with the reference voltage VC. If the sampling voltage VA is higher than the reference voltage VC, then the SAR control circuit 140 determines that the value of the LSB Bit_0 is logic value 1; otherwise, the SAR control circuit 140 determines that the value of the LSB Bit_0 is logic value 0. At this time, the SAR control circuit 140 completes the analog-to-digital conversion of the analog signal VIN and can output a converted digital value DOUT.

Through the switch operation in steps (e) and (g), when the reference voltage VA corresponds to the middle digit, the SAR control circuit 140 may use the sub-capacitor C2_1 of the same conversion unit (that is, the conversion unit 120_2) to perform two times of charge re-distribution of opposite polarities and accordingly perform two times of level adjustment of opposite polarities on the reference voltage VC (without using the capacitor C1 of the conversion unit 120_1).

Thus, although the capacitance of the sub-capacitor C2_1 of the conversion unit 120_2 has numeric deviations, the analog-to-digital converter 1 of the present embodiment of the invention may perform two times of charge re-distribution of opposite polarities on the sub-capacitor of the same conversion unit to effectively eliminate the level shift of the voltage VC caused by the capacitance deviation of the sub-capacitor C2_1. In comparison to the conventional SAR analog-to-digital converter, the SAR analog-to-digital converter of the present embodiment of the invention has the advantage of performing self linear compensation on the level shift caused by capacitance mismatching.

Conversely, when the next bit Bit_1 and the MSB Bit_2 correspond to the same logic value, this implies that the sampling voltage VA corresponds to the boundary digit of the digital value DOUT such as $(11x)_2$ or $(00x)_2$. Thus, the SAR control circuit 140 executes step (h) to trigger a level switch event on the conversion unit 120_1 and re-distributes the charges stored in the capacitor C1 to adjust the comparison voltage VC.

In other words, in the operating example in which the sampling voltage VA corresponds to the boundary digit of the digital value DOUT, the analog-to-digital converter 1 performs two times of level adjustment on the comparison voltage VC. In the two times of level adjustment, the polarity is the same, and there are not any possibilities to perform self linear compensation which can effectively eliminate the mismatching of the capacitance of the sub-capacitor C2_1. Thus, the SAR control circuit 140 drives the capacitor C1 of the conversion unit 120_1 to perform charge re-distribution so as to correspondingly adjust the reference voltage VC to the level VCM−3(VDD−VSS)/8 from the level VCM−(VDD−VSS)/4 or adjust the reference voltage VC to the level VCM+3(VDD−VSS)/8 from the level VCM+(VDD−VSS)/4. After that, the comparator 130 compares the sampling voltage VA with the reference voltage VC. If the sampling voltage VA is higher than the reference voltage VC, then the SAR control circuit 140 determines that the value of the LSB Bit_0 is logic value 1; otherwise, the SAR control circuit 140 determines that the value of the LSB Bit_0 is logic value 0. At this time, the SAR control circuit 140 completes the analog-to-digital conversion of the analog signal VIN and can output a converted digital value DOUT.

Second Embodiment

The analog-to-digital converter of the present embodiment of the invention can be a 4-bit or more-than-4-bit analog-to-digital converter used to correspondingly generate a digital value of 4 bits or more than 4 bits.

Figure 4:
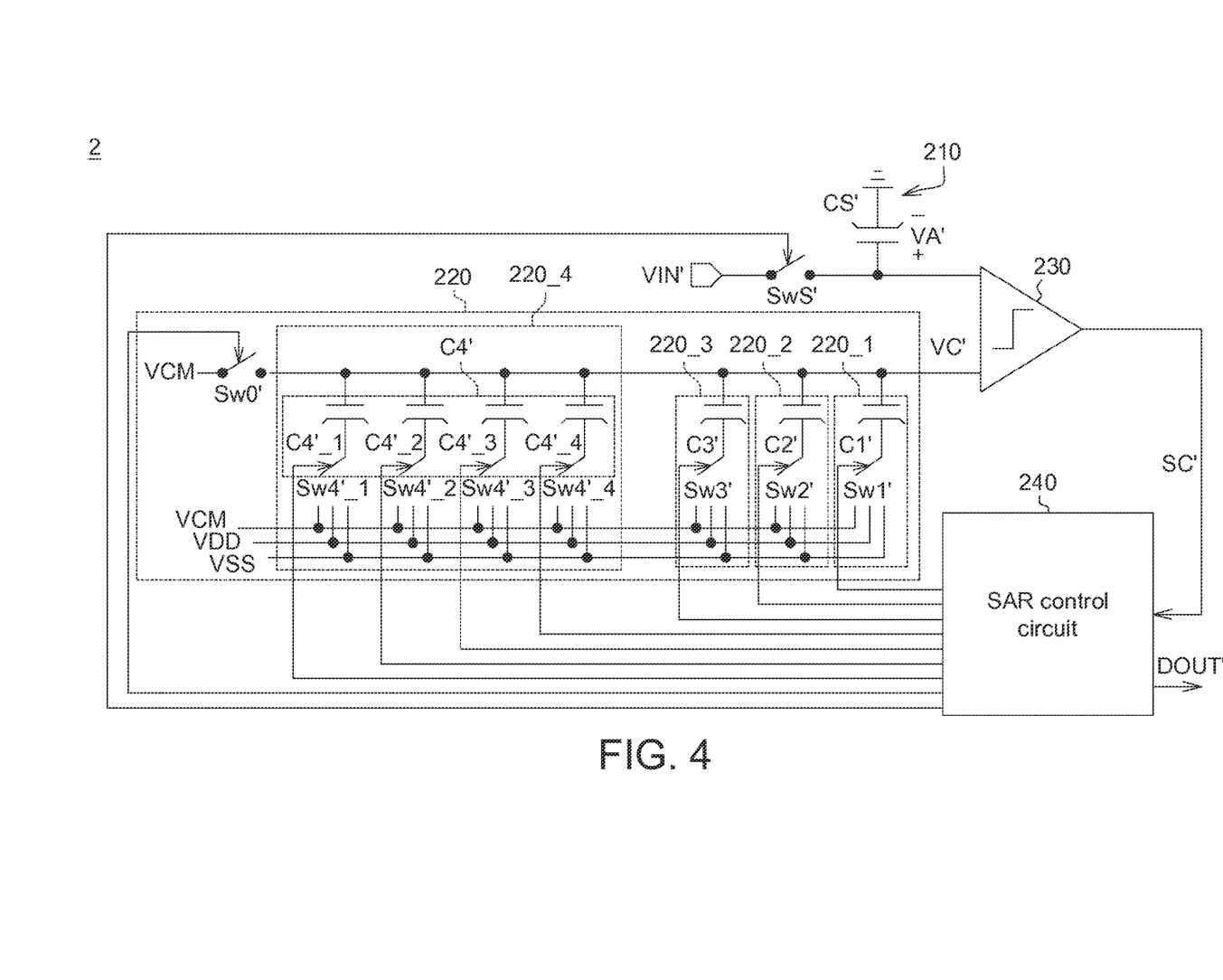
FIG. 4 shows a block diagram of an SAR analog-to-digital converter according to a second embodiment of the invention.

Referring to FIG. 4, a block diagram of an SAR analog-to-digital converter according to a second embodiment of the invention is shown. In the present embodiment, N is equal to 5. In other words, the capacitive digital-to-analog conversion circuit 220 comprises conversion units 220_4 to 220_1 corresponding to bits Bit_4, Bit_3, Bit_2 and Bit_1 of the digital value DOUT' respectively.

Furthermore, the conversion units 220_1 to 220_3 comprise capacitors C1', C2' and C3' respectively, wherein the capacitance ratio of the capacitors C1', C2' and C3' is 1:2:4. In other words, the capacitances of the capacitors C1', C2' and C3' substantially form a numeric relationship of the power of 2. The conversion unit 220_1 to 220_3 further comprise switches Sw1', Sw2' and Sw3' respectively controlled by the SAR control circuit 240 to selectively provide one of the high level reference voltage VDD, the low level reference voltage VSS and the ground reference voltage VCM to one end of the capacitors C1', C2' and C3'. By changing the voltage at one end of the capacitors C1', C2' and C3', the charges of the capacitor C1', C2' and C3' are re-distributed and the level of the comparison voltage VC is adjusted.

The conversion unit 220_4 includes sub-capacitors C4'_1, C4'_2, C4'_3 and C4'_4, wherein the sub-capacitors C4'_1 and C4'_2 have substantially the same capacitances with the capacitor C3' and C2' respectively, and the sub-capacitors C4'_3 has substantially the same capacitance with the capacitor C1'. The conversion unit 220_4 further includes switches Sw4'_1, Sw4'_2, Sw4'_3 and Sw4'_4 controlled by the SAR control circuit 240 respectively to selectively provide one of the high level reference voltage VDD, the low level reference voltage VSS and the ground reference voltage VCM to one end of the sub-capacitors C4'_1 to C4'_4. By changing the voltage at one end of the capacitors C4'_1 to C4'_4, the charges of the sub-capacitors C4'_1 to C4'_4 are re-distributed and the level of the comparison voltage VC' is adjusted. In an operating example, the switches Sw4'_1 to Sw4'_4 connect the sub-capacitors C4'_1 to C4'_4 in parallel to correspondingly form an equivalent capacitor C4'. The capacitance ratio of the equivalent capacitor C4' and the capacitor C3, C2' and C1' is such as 8:4:2:1, but the invention is not limited thereto. The capacitance of the equivalent capacitor C4' can also be equal to the sum of the capacitances of the capacitors C3', C2' and C1' plus any capacitance or 0.

Figure 5A:
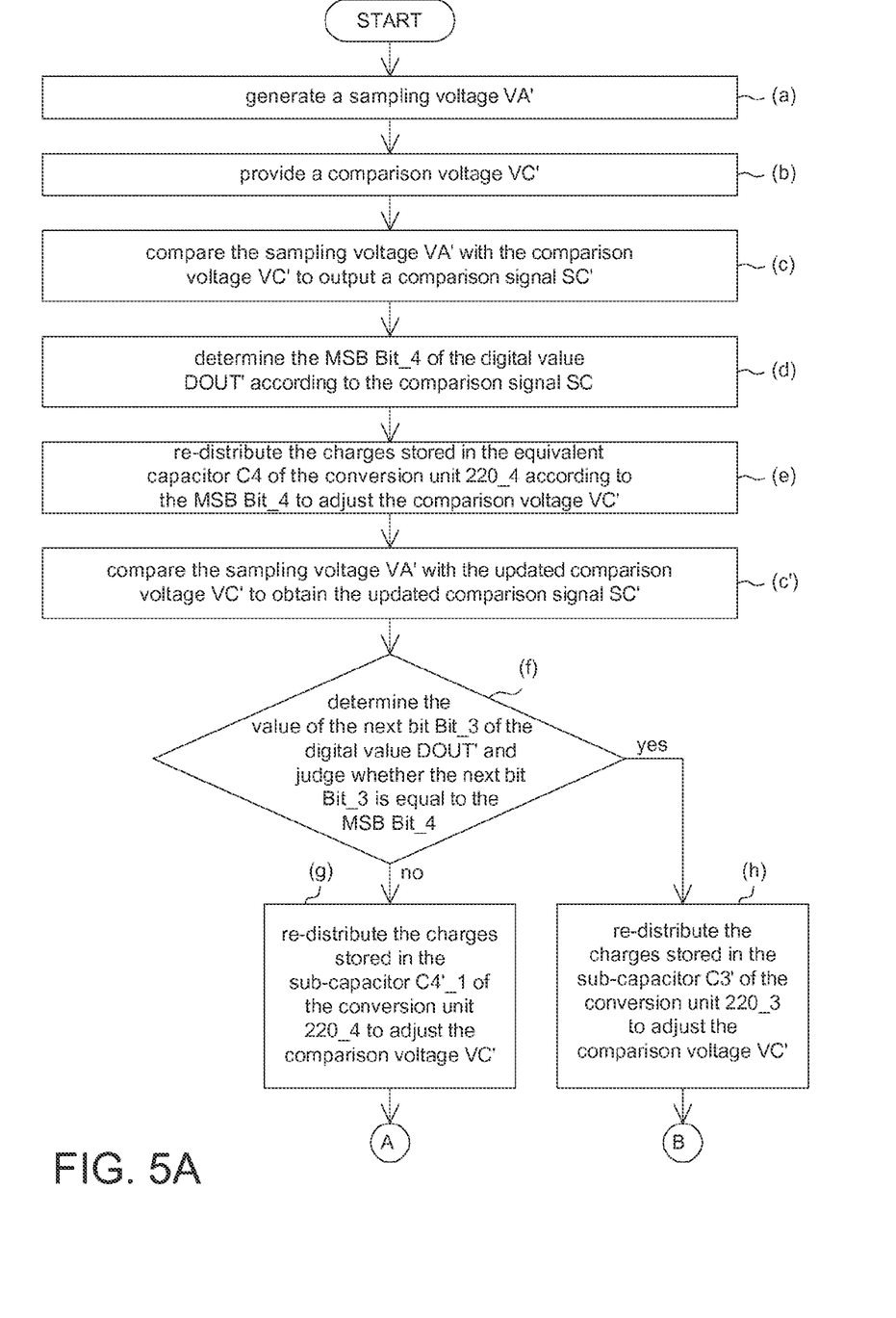
Figure 5B:
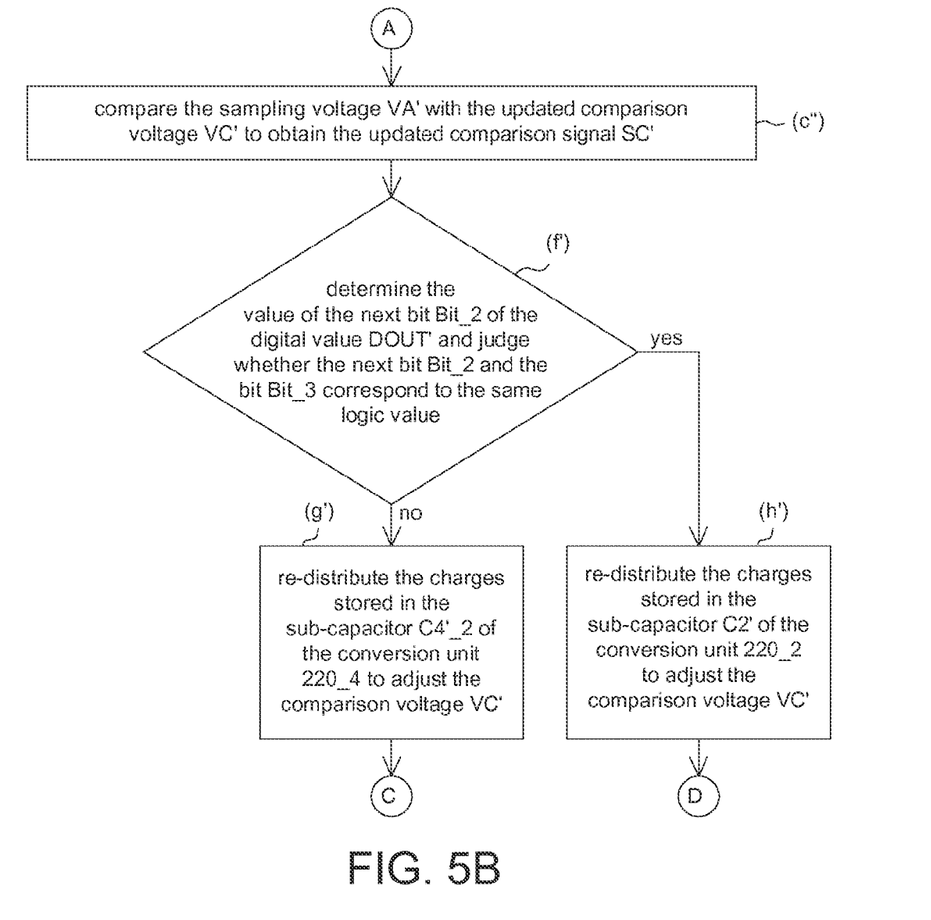
Figure 5C:
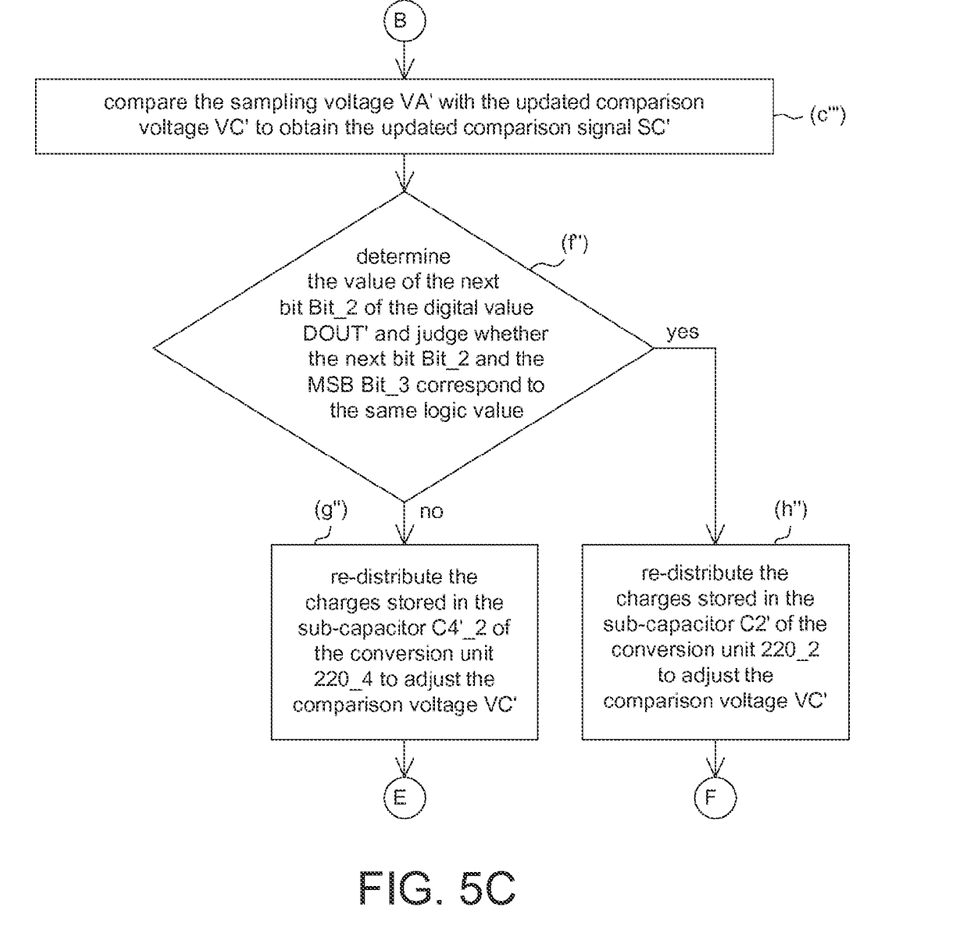

Referring to FIGS. 5A-5C, another flowchart of an analog-to-digital conversion method according to a second embodiment of the invention is shown. The SAR control circuit 240 performs an operation similar to that performed by the SAR control circuit 140 to determine a sampling-and-hold period and a decoding operation period, and executes an analog-to-digital conversion method during the above periods to control the analog-to-digital converter 2 to perform conversion on the analog signal VIN' to obtain a digital value DOUT'. Detailed operations are disclosed below with accompanying examples.

Steps (a)~(h) of FIG. 5A are similar to steps (a)~(h) of the analog-to-digital conversion method of FIG. 2, and the similarities are not repeated here.

Following step (g), the analog-to-digital conversion method of the present embodiment of the invention comprises steps (c'') and (f')~(h') of FIG. 5B. Firstly, in step (c''), the comparator 230 compares the sampling voltage VA' with an updated comparison voltage VC' to obtain an updated comparison signal SC'. For example, the updated comparison signal SC' indicates the relationship between the sampling voltage VA' and the comparison voltage VC' (substantially equal to VCM+(VDD−VSS)/8 or VCM−(VDD−VSS)/8).

Next, the method proceeds to step (f'), the SAR control circuit 240 determines the next bit Bit_2 of the digital value DOUT' according to the updated comparison signal SC' and judges whether the bits Bit_2 and bit Bit_3 correspond to the same logic value. If no, then method proceeds to step (g'), the SAR control circuit 240 triggers a level switch event on the conversion unit 220_4 and re-distributes the charges stored in the sub-capacitor C4'_2 to update the comparison voltage VC'.

Conversely, when the bits Bit_2 and Bit_3 correspond to the same logic value, step (h') is executed. In step (h'), the SAR control circuit 240 triggers a level switch event on the conversion unit 220_2 and re-distributes the charges stored in the capacitor C2' to update the comparison voltage VC'.

Following step (h), the analog-to-digital conversion method of the present embodiment of the invention includes steps (c''') and (f'')~(h'') of FIG. 5C. Firstly, in step (c'''), the comparator 230 compares the sampling voltage VA' with the updated comparison voltage VC' to obtain the updated comparison signal SC'. For example, the updated comparison signal SC' indicates the relationship between the sampling voltage VA' and the comparison voltage VC' (substantially equal to VCM+3(VDD−VSS)/8 or VCM−3(VDD−VSS)/8).

Next, the method proceeds to step (f''), the SAR control circuit 240 determines the next bit Bit_2 of the digital value DOUT' according to the updated comparison signal SC and judge whether bit Bit_2 and bit Bit_3 correspond to the same logic value. If no, then the method proceeds to step (g''). In step (g''), the SAR control circuit 240 triggers a level switch event on the conversion unit 220_4 and re-distributes the charges stored in sub-capacitors C4'_2 to update the comparison voltage VC'.

Conversely, when bit Bit_2 and bit Bit_3 correspond to the same logic value, step (h'') is executed. In step (h''), the SAR control circuit 240 triggers a level switch event on the conversion unit 220_2 and re-distributes the charges stored in the capacitor C2' to update the comparison voltage VC'. VC'.

Following steps (g'), (h'), (g''), (h''), the analog-to-digital conversion method of the present embodiment of the invention further executes steps similar to steps (c''), (f')~(h') or step (c'''), (f'')~(h'') to continue to obtain bit Bit_1 and Bit_0 by way of signal decoding. Since the procedures of these steps are similar to the steps of FIG. 5B and FIG. 5C, the similarities are not repeated here.

In the above embodiments of the present invention, the analog-to-digital converter includes the circuit structure of FIG. 1 and FIG. 4, but the analog-to-digital converter of the present embodiment of the invention is not limited thereto. In other examples, the analog-to-digital converter of the present embodiment of the invention may also be implemented by other way of capacitor switching.

Figure 6:
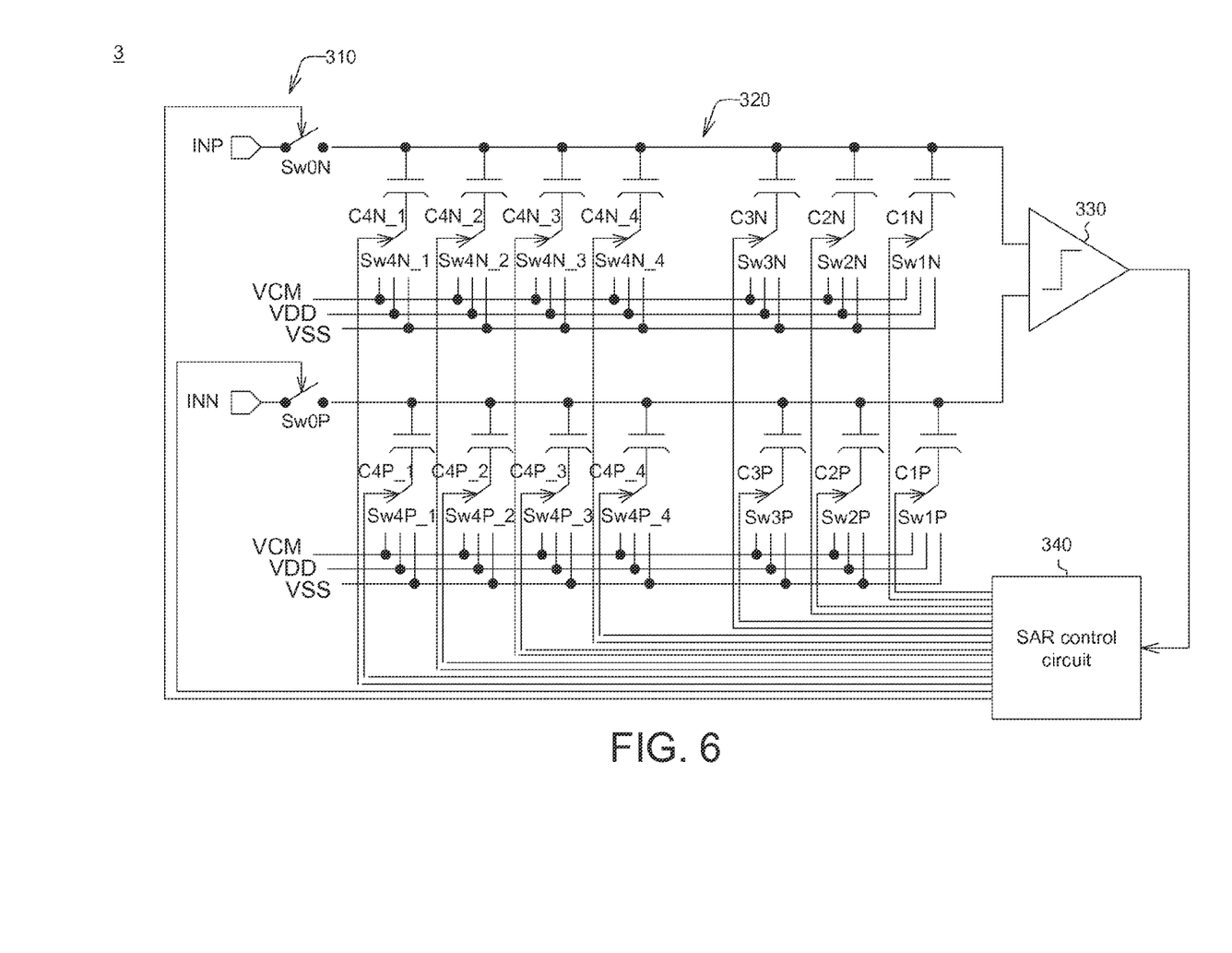
FIG. 6 shows another block diagram of an SAR analog-to-digital converter according to a third embodiment of the invention.

Referring to FIG. 6, another block diagram of an SAR analog-to-digital converter according to a third embodiment of the invention is shown. In another example, the sampling-and-hold circuit 310, the capacitive digital-to-analog conversion circuit 320 and the comparator 330 of the present embodiment of the invention can also be implemented by way of differential inputting. The sampling-and-hold circuit 310 can be implemented by providing the input signal INP to one end of the capacitors at the upper row and providing the input signal INN to one end of the capacitors at the lower row. Through the operation of capacitor switching similar to that used in the above embodiments, the analog-to-digital converter 3 of the present embodiment of the invention may perform two times of charge re-distribution of opposite polarities on the sub-capacitors of the same conversion unit to effectively eliminate the level shift of the voltage VC caused by the capacitance deviation of the sub-capacitor. The analog-to-digital converter 3 of the present embodiment of the invention further has the advantage of performing self linear compensation on the level shift caused by capacitance mismatching.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An analog-to-digital conversion method used in a successive approximation (SAR) analog-to-digital converter to convert an analog signal to obtain a digital value, wherein the digital value comprises an (N−1)-th to a 0-th bit sequentially corresponding to the most significant bit (MSB) to the least significant bit (LSB) of the digital value respectively, N is an integer greater than 1, and the analog-to-digital conversion method comprises:

using a sampling-and-hold circuit to sample the analog signal to generate a sampling voltage;

using a capacitive digital-to-analog conversion circuit to provide a comparison voltage, wherein the capacitive digital-to-analog conversion circuit comprises N−1 conversion units being an (N−1)-th conversion unit, and an (N−2)-th conversion unit to a first conversion unit, the first conversion unit to the (N−2)-th conversion unit comprise a first capacitor to an (N−2)-th capacitor respectively, the (N−1)-th conversion unit at least comprises a first sub-capacitor and a second sub-capacitor to an (N−2)-th sub-capacitor, and each of the first sub-capacitor to the (N−2)-th sub-capacitor has substantially the same capacitance with corresponding capacitor of the (N−2)-th capacitor to the first capacitor;

using a comparator to compare the sampling voltage with the comparison voltage to generate a comparison signal;

using an SAR control circuit to determine the (N−1)-th bit of the digital value according to the comparison signal;

using the SAR control circuit to re-distribute the charges stored in at least the first sub-capacitor to the (N−2)-th sub-capacitor of the (N−1)-th conversion unit according to the (N−1)-th bit to update the comparison voltage;

using the comparator to compare the sampling voltage with the updated comparison voltage to obtain the updated comparison signal following the step of updating the comparison voltage;

using the SAR control circuit to determine the (N−2)-th bit of the digital value according to the updated comparison signal and judge whether the (N−1)-th and the (N−2)-th bit correspond to the same logic value; and using the SAR control circuit to re-distribute the charges stored in at least one of the first sub-capacitor to the (N−2)-th sub-capacitor of the (N−1)-th conversion unit to update the comparison voltage when the (N−1)-th bit and the (N−2)-th bit correspond to different logic values.

2. The analog-to-digital conversion method according to claim 1, wherein in the step of re-distributing the charges stored in at least one of the first sub-capacitor to the (N−2)-th sub-capacitor of the (N−1)-th conversion unit to update the comparison voltage, the SAR control circuit re-distributes the charges stored in the first sub-capacitor of the (N−1)-th conversion unit to update the comparison voltage.

3. The analog-to-digital conversion method according to claim 2, wherein the analog-to-digital conversion method further comprises:

using the comparator to compare the sampling voltage with the updated comparison voltage to obtain the updated comparison signal following the step of re-distributing the charges stored in at least one of the first sub-capacitor to the (N−2)-th sub-capacitor of the (N−1)-th conversion unit to update the comparison voltage;

using the SAR control circuit to determine the (N−3)-th bit of the digital value according to the updated comparison signal and judge whether the (N−3)-th bit and the (N−2)-th bit correspond to the same logic value; and using the SAR control circuit to re-distribute the charges stored in the second sub-capacitor to update the comparison voltage when the (N−3)-th bit and the (N−2)-th bit correspond to different logic values.

4. The analog-to-digital conversion method according to claim 3, wherein following the step of determining the (N−3)-th bit of the digital value, the method further comprises:

using the SAR control circuit to re-distribute the charges stored in the (N−3)-th capacitor to update the comparison voltage when the (N−3)-th bit and the (N−2)-th bit correspond to the same logic value.

5. The analog-to-digital conversion method according to claim 1, wherein following the step of determining the (N−3)-th bit of the digital value, the method further comprises:
using the SAR control circuit to re-distribute the charges stored in the (N−2)-th capacitor to update the comparison voltage when the (N−1)-th bit and the (N−2)-th bit correspond to the same logic value.

6. The analog-to-digital conversion method according to claim 5, wherein the method further comprises:
using the comparator to compare the sampling voltage with the updated comparison voltage to obtain the updated comparison signal following the step of using the SAR control circuit to re-distribute the charges stored in the (N−2)-th capacitor to update the comparison voltage when the (N−1)-th bit and the (N−2)-th bit correspond to the same logic value;
using the SAR control circuit to determine the (N−3)-th bit of the digital value according to the updated comparison signal and judge whether the (N−3)-th bit and the (N−2)-th bit correspond to the same logic value; and
using the SAR control circuit to re-distribute the charges stored in the second sub-capacitor to update the comparison voltage when the (N−3)-th bit and the (N−2)-th bit correspond to different logic values.

7. The analog-to-digital conversion method according to claim 6, wherein following the step of using the SAR control circuit to determine the (N−3)-th bit of the digital value according to the updated comparison signal and judge whether the (N−3)-th bit and the (N−2)-th bit correspond to the same logic value, the method further comprises:
using the SAR control circuit to re-distribute the charges stored in the (N−3)-th capacitor to update the comparison voltage when the (N−3)-th bit and the (N−2)-th bit correspond to the same logic value.

8. A successive approximation (SAR) analog-to-digital converter, wherein the SAR analog-to-digital converter performs conversion on an analog signal to obtain a digital value comprising an (N−1)-th to a 0-th bit sequentially corresponding to the MSB to the LSB of the digital value respectively, N is an integer greater than 1, and the analog-to-digital converter comprises:
a sampling-and-hold circuit used to sample the analog signal to generate a sampling voltage;
a capacitive digital-to-analog conversion circuit used to provide a comparison voltage comprising N−1 conversion units being an (N−1)-th conversion unit, and an (N−2)-th conversion unit to a first conversion unit, the first conversion unit to the (N−2)-th conversion unit comprise a first capacitor to an (N−2)-th capacitor respectively, the (N−1)-th conversion unit at least comprises a first sub-capacitor, and a second sub-capacitor to an (N−2)-th sub-capacitor, and each of the first sub-capacitor to the (N−2)-th sub-capacitor has substantially the same capacitance with corresponding capacitor of the (N−2)-th capacitor to the first capacitor;
a comparator used to compare the sampling voltage and the comparison voltage to generate a comparison signal; and
an SAR control circuit used to determine the (N−1)-th bit of the digital value according to the comparison signal and re-distribute the charges stored in at least the first sub-capacitor to the (N−2)-th sub-capacitor of the (N−1)-th conversion unit according to the (N−1)-th bit to update the comparison voltage;
wherein the comparator is further used to compare the sampling voltage with the updated comparison voltage to obtain the updated comparison signal;
wherein the SAR control circuit is used to determine the (N−2)-th bit of the digital value according to the updated comparison signal and judges whether the (N−1)-th and the (N−2)-th bit correspond to the same logic value, and when the (N−1)-th bit and the (N−2)-th bit correspond to different logic values, the SAR control circuit further re-distributes the charges stored in at least one of the first sub-capacitor to the (N−2)-th sub-capacitor of the (N−1)-th conversion unit to update the comparison voltage.

9. The analog-to-digital converter according to claim 8, wherein when the (N−1)-th bit and the (N−2)-th bit correspond to different logic values, the SAR control circuit re-distributes the charges stored in the first sub-capacitor of the (N−1)-th conversion unit to update the comparison voltage.

10. The analog-to-digital converter according to claim 9, wherein after the comparison voltage is updated, the comparator further compares the sampling voltage with the updated comparison voltage to obtain the updated comparison signal;
wherein the SAR control circuit determines the (N−3)-th bit of the digital value according to the updated comparison signal and judges whether the (N−3)-th bit and the (N−2)-th bit correspond to the same logic value, and when the (N−3)-th bit and the (N−2)-th bit correspond to different logic values the SAR control circuit further re-distributes the charges stored in the second sub-capacitor to update the comparison voltage.

11. The analog-to-digital converter according to claim 10, wherein when the (N−3)-th bit and the (N−2)-th bit correspond to the same logic value, the SAR control circuit re-distributes the (N−3)-th capacitor to update the comparison voltage.

12. The analog-to-digital converter according to claim 8, wherein when the (N−1)-th bit and the (N−2)-th bit correspond to the same logic value, the SAR control circuit re-distributes the (N−2)-th capacitor to update the comparison voltage.

13. The analog-to-digital converter according to claim 12, wherein after the comparison voltage is updated, the comparator compares the sampling voltage with the updated comparison voltage to obtain the updated comparison signal;
wherein the SAR control circuit determines the (N−3)-th bit of the digital value according to the updated comparison signal and judges whether the (N−3)-th bit and the (N−2)-th bit correspond to the same logic value, and when the (N−3)-th bit and the (N−2)-th bit correspond to different logic values, the SAR control circuit further re-distributes the second sub-capacitor to update the comparison voltage.

14. The analog-to-digital converter according to claim 13, wherein when the (N−3)-th bit and the (N−2)-th bit correspond to the same logic value, the SAR control circuit re-distributes the (N−3)-th capacitor to update the comparison voltage.

* * * * *